(12) United States Patent
Solomko et al.

(10) Patent No.: US 8,907,702 B1
(45) Date of Patent: Dec. 9, 2014

(54) SYSTEM AND METHOD FOR A PHASE DETECTOR

(71) Applicant: Infineon Technologies AG, Neubiberg (DE)

(72) Inventors: Valentyn Solomko, Munich (DE); Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/975,914

(22) Filed: Aug. 26, 2013

(51) Int. Cl.
*G01R 25/00* (2006.01)
*G06G 7/14* (2006.01)
*H03K 3/013* (2006.01)

(52) U.S. Cl.
CPC . *H03K 3/013* (2013.01); *G06G 7/14* (2013.01)
USPC .......................................................... 327/3

(58) Field of Classification Search
USPC .......................................................... 327/3
See application file for complete search history.

(56) References Cited

U.S. PATENT DOCUMENTS

| 7,576,626 | B2 | 8/2009 | Gorbachov |
| 8,326,234 | B2 | 12/2012 | Bakalski et al. |
| 2013/0147535 | A1 | 6/2013 | Hur et al. |

OTHER PUBLICATIONS

Rubin, S., "A Wide-Band UHF Logarithmic Amplifier," IEEE Journal of Solid-State Circuits, vol. SC-1, No. 2, Dec. 1966, pp. 74-81.
Dehaene, W. et al., "A 100 MHz Highly Accurate CMOS Zero-Phase Detector for Timing Recovery Systems," ESSCIRC, Sep. 19-21, 1995, pp. 258-261.
Tang, C. et al., "S-Band Full 360° High Precision Phase Detector," Proceedings of APMC 2012, Dec. 4-7, 2012, pp. 97-99.
"Directional Couplers," Microwave Encyclopedia, Microwaves101.com, Updated May 12, 2013, 5 pages.
Bahl, "Chapter 12 Lumped-Element Circuits," Artechhouse, Jun. 7, 2003, 42 pages.

*Primary Examiner* — Daniel Rojas
(74) *Attorney, Agent, or Firm* — Slater & Matsil, L.L.P.

(57) ABSTRACT

In accordance with an embodiment, a phase detector circuit includes a plurality of cascaded RF stages that each has a first RF amplifier and a second RF amplifier. The first RF amplifiers are cascaded with first RF amplifiers of successive RF stages, and the second RF amplifiers are cascaded with second RF amplifiers of successive RF stages. The phase detector further includes a first mixer having a first input coupled to an output of a first RF amplifier of a first RF stage and a second input coupled to an output of a second RF amplifier of the first RF stage, and a second mixer having a first input coupled to an output of a second RF amplifier of a second RF stage and a second input coupled to an output of a first RF amplifier of the second RF stage.

27 Claims, 12 Drawing Sheets

SYSTEM AND METHOD FOR A PHASE DETECTOR

TECHNICAL FIELD

The present disclosure relates generally to an electronic device, and more particularly to a system and method for a phase detector.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

For example, a directional coupler may be implemented using stripline structures disposed on a printed circuit board (PCB) or transformers. In some stripline implementations, various circuit elements may be as long as a quarter wavelength of the particular signal being measured. For applications that operate at frequencies between 500 MHz and 3.8 GHz, which covers the frequency range at which many cellular telephones operate, constructing stripline directional couplers on an integrated circuit becomes challenging dues to the wavelengths at these frequencies being much longer than the feature sizes on the integrated circuit. Low-loss magnetic-based directional couplers also are challenging to construct at this range of frequencies because of transformer losses and parasitics.

SUMMARY OF THE INVENTION

In accordance with an embodiment, a phase detector circuit includes a plurality of cascaded RF stages that each has a first RF amplifier and a second RF amplifier. The first RF amplifiers are cascaded with first RF amplifiers of successive RF stages, and the second RF amplifiers are cascaded with second RF amplifiers of successive RF stages. The phase detector further includes a first mixer having a first input coupled to an output of a first RF amplifier of a first RF stage and a second input coupled to an output of a second RF amplifier of the first RF stage, and a second mixer having a first input coupled to an output of a second RF amplifier of a second RF stage and a second input coupled to an output of a first RF amplifier of the second RF stage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used in RF circuits to measure incident or reflected power. Embodiments of the present invention may also be applied to other systems and applications including other circuits that utilize phase detectors such as phase-lock loop (PLL) circuits and power detectors. Moreover embodiment may be directed to systems that make RF measurements including, but not limited to devices that measure and/or tune impedance mismatch, time domain reflectometers (TDR), sensing devices for use with tunable antenna matching circuits, and tunable filters.

In an embodiment of the present invention, an impedance measurement device includes a phase-shift network coupled to transformer having a primary winding and secondary winding. The primary winding of the transformer is coupled in series with a transmission path of the impedance measurement device. The secondary winding of the transformer and the phase shifter is loaded by high-impedance measurement device that determines the quality of the impedance match and/or the absolute or relative magnitude and/or phase of an incident and/or reflected signal between ports of the transmission path.

In an embodiment, information about the amplitude and phase of current and voltage of the RF signal is extracted and compared with a predefined value, such as, but not limited to a 50Ω impedance. The relationship between the extracted amplitudes and phases of the RF current and voltage indicates the amount of reflection in the RF signal path and therefore indicates the load impedance. For example, the smaller the reflection, the closer the load impedance is close to the characteristic impedance $Z_0$:

$$Z_L = Z_0 \frac{1+\Gamma_0}{1-\Gamma_0},$$

where $Z_L$ represents load impedance, $Z_0$ represents the characteristic impedances, which may be 50Ω Ohms, and $\Gamma_0$ represents the reflection coefficient. In some embodiments, a magnetic transformer generates a voltage proportional to an RF current and an RC network generates voltage proportional to an RF voltage. In some embodiments, the coupler is constructed such that amplitudes and phases of the voltage proportional to the RF current and the voltage proportional to the RF voltage are 180 degrees out of phase and have the same amplitude when there is no reflection in the RF signal path.

Figure 1A:
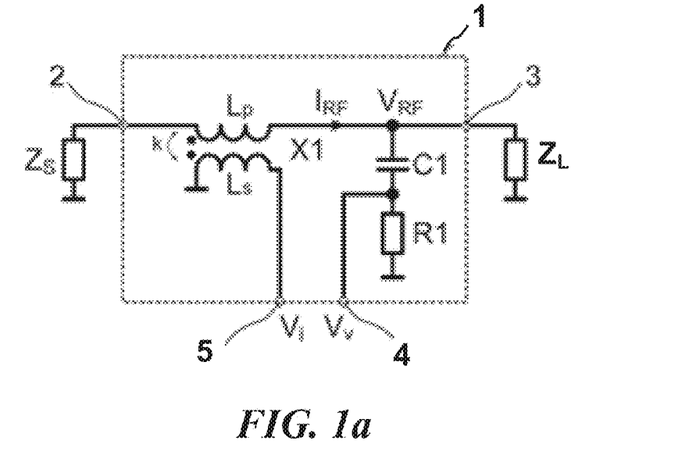
FIGS. 1a-f illustrate an embodiment coupler circuits and corresponding waveform diagrams.

Referring to FIG. 1a, the coupler 1 is a four-port device with ports 2 and 3 being the 50-Ohm ports for RF signal and two coupled ports 4 and 5 loaded with a high impedance. Coupler 1 includes transformer X1 with primary winding Lp coupled between source impedance $Z_S$ and load impedance $Z_L$. A phase-shifting network implemented by a high-pass RC filter that includes resistor $R_1$ and capacitor $C_1$ is coupled to the port 3. Using the equation for an ideal transformer that is loaded with a high impedance the voltage at port 5 can be expressed as:

$$V_i = j\omega \cdot k\sqrt{L_p L_s} \cdot I_{RF}, \quad (1)$$

where $L_p$ and $L_s$ are the self-inductance of primary and secondary windings of transformer X1, and k is a coupling factor between primary and secondary windings of X1.

The voltage Vv at port 4 can be expressed as:

$$V_v = \frac{j\omega R_1 C_1}{j\omega R_1 C_1 + 1} \cdot V_{RF} \quad (2)$$

When the cut-off frequency of the RC network is well above the operating frequency range of the coupler, namely $$\omega \ll \frac{1}{R_1 C_1}, \quad (3)$$

equation (2) may be approximated as follows:

$$V_v \approx j\omega R_1 C_1 \cdot V_{RF}. \quad (4)$$

In an embodiment, the various components and parameters k, $L_P$, $L_S$, $R_1$ and $C_1$ are chosen to meet the following condition:

$$\frac{k\sqrt{L_p L_s}}{R_1 C_1} = Z_0, \quad (5)$$

where $Z_0$ is a reference impedance. In some embodiments, $Z_0$ may be set to the characteristic impedance of the system, which may be, for example, 50Ω, or another impedance. If load impedance $Z_L$ for the RF signal at port 3 is equal to the reference impedance $Z_0$, than from equations (1), (4) and (5) it follows that $$V_v + V_i = 0 \quad (6a)$$

because $|V_v| = |V_i|$ and $\angle V_v - \angle V_i = 180°$. In the case of an impedance mismatch, for example, when $Z_L \neq Z_0$, $$V_v + V_i \neq 0. \quad (6b)$$

Figure 1B:
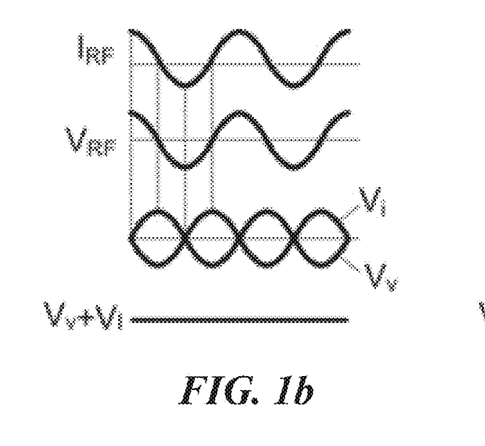
Figure 1C:
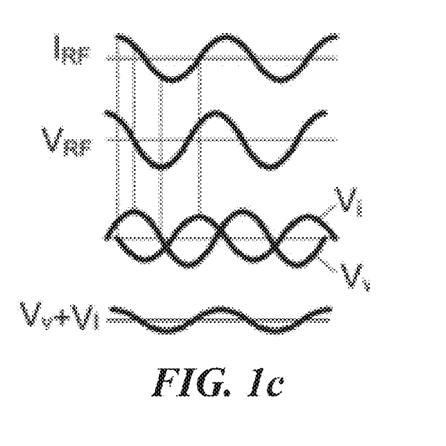

FIGS. 1b and 1c include waveform diagrams that illustrate the relationship between voltages Vi and Vv under matched impedance conditions and mismatched impedance conditions with respect to the circuit of FIG. 1a. FIG. 1b illustrates a waveform diagram showing the relationship between the input and output currents measurement output voltages of an embodiment coupler under matched impedance conditions. As shown, current $I_{RF}$ and voltage $V_{RF}$ are in-phase with each other with relative amplitudes that follow the following relationship:

$$\frac{V_{RF}}{I_{RF}} = Z_0.$$

Consequently, voltages Vi and Vv at port 5 and port 4, respectively have equal amplitudes and are 180 degrees out of phase with each other such that the sum of Vi and Vv is zero and/or is a DC voltage. In some embodiments, the node at port 5 that produces Vi may be referred to as a current measurement node, and the node at port 4 that produces Vv may be referred to as a voltage measurement node.

FIG. 1c illustrates a waveform diagram showing the relationship between the input and output currents measurement output voltages of an embodiment coupler under mismatched impedance conditions. As shown, current $I_{RF}$ and voltage $V_{RF}$ are out of phase with each other with relative amplitudes in which:

$$\frac{V_{RF}}{I_{RF}} \neq Z_0.$$

Under this condition, voltages Vi and Vv at port 5 and port 4, respectively have unequal amplitudes and are not 180 degrees out of phase with each other. Therefore, the sum of Vi and Vv has an AC component. It should be understood that the sum of Vi and Vv may have an AC components in conditions in which Vi and Vv are in phase with each other but have unequal amplitudes, or under conditions in which Vi and Vv are out of phase with each other but have equal amplitudes. In alternative embodiments, the amplitudes and phases of Vi and Vv may be scaled such an unequal amplitude condition and/or an out of phase condition represents a matched impedance conditions. This could occur, for example, in implementations that utilize phase shift networks that do not produce a 90° phase shift, amplitude scaling networks that produce non-equal amplitudes at matched conditions, embodiments that omit analog phase shift networks. Such embodiments may occur due to the presence of device parasitics and/or may result in situations where component values and parameters are constrained to make a 90° phase shift and matched amplitude for Vi and Vv under matched impedance conditions impractical. In such embodiments, the requisite scaling and phase shift needed to determine a matched impedance condition may be performed during post-processing in the analog or digital domain.

Embodiment couplers and impedance mismatch measurement circuits may be used to monitor incident and reflected RF power. Referring to FIG. 1a, if port 2 is considered an input port and port 3 is a transmission port then the sum of signals Vv and Vi will indicate the reflected power such that the difference between Vv and Vi is proportional to incident power. For example:

$$V_{RF} = V_{RF}^+ + V_{RF}^- \quad (7)$$

$$I_{RF} = I_{RF}^+ - I_{RF}^- = \frac{V_{RF}^+}{Z_0} - \frac{V_{RF}^-}{Z_0}, \quad (8)$$

where $V_{RF}^+$ and $I_{RF}^+$ are incident voltage and current, $V_{RF}^-$ and $I_{RF}^-$ are the reflected voltage and current. Substituting (7) and (8) into (1) and (4) results in:

$$V_i = -j\omega \cdot k\sqrt{L_p L_s} \cdot \frac{V_{RF}^+}{Z_0} + j\omega \cdot k\sqrt{L_p L_s} \cdot \frac{V_{RF}^-}{Z_0}, \quad (9)$$

and $$V_v \approx j\omega R_1 C_1 \cdot V_{RF}^+ + j\omega R_1 C_1 \cdot V_{RF}^-. \quad (10)$$

According to (5):

$$\frac{k\sqrt{L_p L_s}}{R_1 C_1} = Z_0 \Rightarrow \frac{k\sqrt{L_p L_s}}{Z_0} = R_1 C_1 \quad (11)$$

Substituting (11) into (9) results in:

$$V_i = -j\omega \cdot R_1 C_1 \cdot V_{RF}^+ + j\omega \cdot R_1 C_1 \cdot V_{RF}^- \quad (12)$$

Finally, by adding and subtracting voltages, as shown in equations (10) and (12), reflected and incident power in the RF line can be monitored as follows:

$$V_v + V_i = 2j\omega \cdot R_1 C_1 \cdot V_{RF}^- \Rightarrow \text{reflected wave monitoring}$$

$$V_v - V_i = 2j\omega \cdot R_1 C_1 \cdot V_{RF}^+ \Rightarrow \text{incident wave monitoring.}$$

If the input and transmitted ports of the coupler are swept such that port 3 is considered an input port and port 2 is considered a transmission port, then the sum of signals Vv and Vi indicates the incident power and difference between Vv and Vi indicates the reflected power.

Figure 1D:
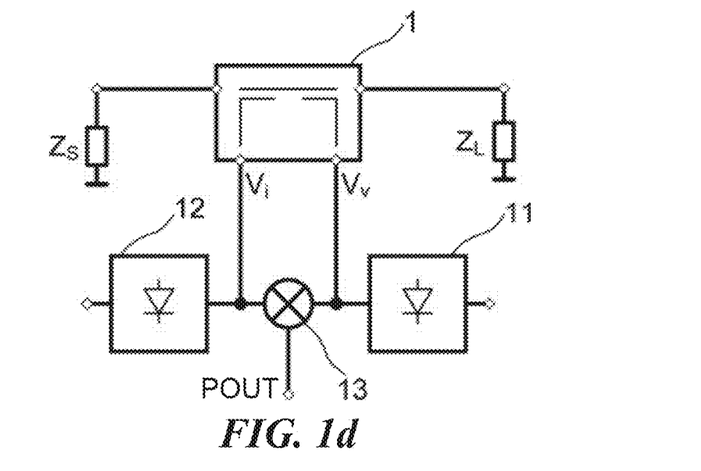

FIG. 1d illustrates an embodiment reflection measurement circuit having embodiment coupler 1 that is coupled to power detectors 11 and 12. Power detectors 11 and 12 produce a value proportional to a current and voltage portion of the RF signal while the phase detector 13 detects the phase difference between the Vi and Vv. In matched conditions, the outputs of both detectors are equal to each other and the phase difference between signals is 180°. In some embodiments, phase detector 13 may be implemented using circuits and systems known in the art. For example, phase detector 13 may be implemented using an exclusive-or (XOR) gate, an analog mixer, a digital latch circuit, or using other circuits and methods known in the art.

Figure 1E:
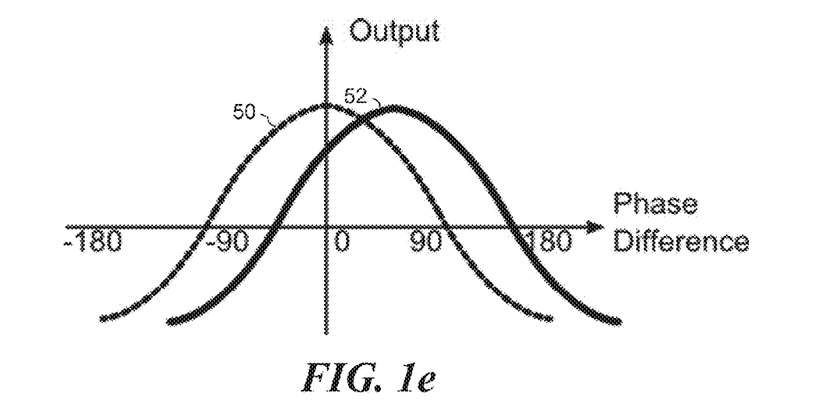

In some cases, phase detector 13 may have an asymmetric time delay with respect to the time delay from Vi to node POUT and the time delay from node Vv to node POUT due to asymmetric signal paths within phase detector 13. This asymmetric time delay may cause a phase shift at the output of phase detector 13. This phase shift is illustrated in FIG. 1e, which shows waveform 50 representing an ideal output versus phase difference graph and waveform 52 representing an output versus phase different graph for a phase detector having an asymmetric time delay. As shown, waveform 50, representing the ideal phase detector transfer function, has a maximum output at about 0° phase difference. On the other hand, waveform 52, representing the phase detector transfer function for the device having asymmetric time delay, has a peak output at about 70°. This asymmetric transfer function may be exacerbated at higher frequencies where a particular delay represents a greater phase shift.

Figure 1F:
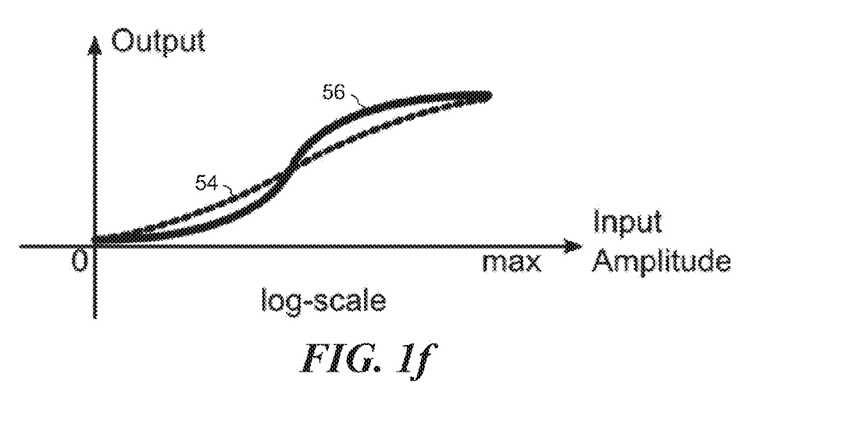

Another issue with phase detectors that are implemented using double balanced mixtures is that the phase detector has a linear conversion gain that limits the dynamic range the phase detector. FIG. 1f illustrates a comparison between a phase detector having a log-linear amplitude response 54 and a phase detector having a limited linear response 56. As shown, log-linear response 54 has a higher gain at lower input amplitudes.

In an embodiment, two logarithmic amplifiers are implemented using cascades of linear amplifiers to produce a log-linear response. Asymmetric time delays within phase detectors are compensated by using multiple phase detectors that are cross-connected after each gain stage, as illustrated in FIG. 2a, which shows phase detector 200 according to an embodiment of the present invention.

Figure 2A:
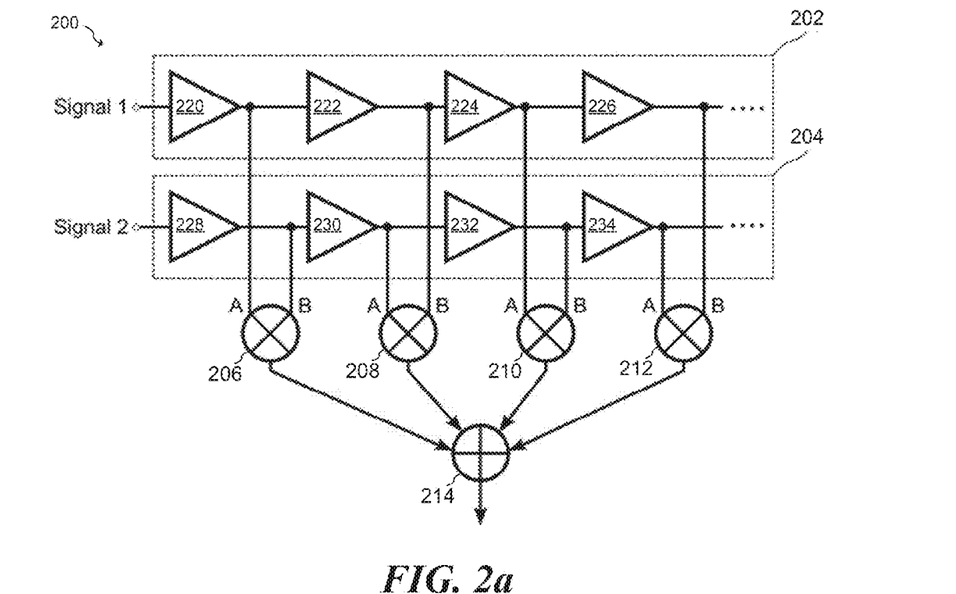
FIGS. 2a-b illustrate schematics of embodiment phase detectors.

Referring to FIG. 2a, two coherent RF signals are applied to two logarithmic RF amplifiers 202 and 204. Each logarithmic amplifier consists of n gain stages. In the illustrated embodiment, a logarithmic amplifier 202 has four amplifiers 220, 222, 224 and 226, and logarithmic amplifier 204 also has four amplifiers 228, 230, 232, and 234. Alternatively, greater or fewer gain stages may be used in each logarithmic amplifier such that n is greater than or equal to 2. Phase detection is performed by mixers 206, 208, 210 and 212, each having two inputs A and B, and an output. In some cases, inputs A may be referred to as "type A" inputs and inputs B may be referred to as "type B" inputs. Inputs of mixers 206, 208, 210 and 212 are coupled to each stage of the logarithmic amplifiers in an interchangeable order: every odd stage of the amplifier 202 is coupled to inputs A of the mixers, while every even stage of the amplifier 202 is coupled to inputs B of the mixers. Likewise, every odd stage of the amplifier 204 is coupled to inputs B of the mixers, while every even stage of the amplifier 204 is coupled to inputs A of the mixers. Signals from all mixers are summed up together with the adder 214 in the current domain or in the voltage domain. In alternative embodiments, mixers 206, 208, 210 and 212 may be coupled to the outputs of amplifiers 220, 222, 224, 226, 228, 230, 232, and 234 using various input polarities besides reversing the connections of every other mixer. For example, in some embodiments, two consecutive mixers may be coupled using a same polarity or mixers may be coupled to only a subset of amplifiers to yield a pattern that reduces and/or minimizes phase offset.

Figure 2B:
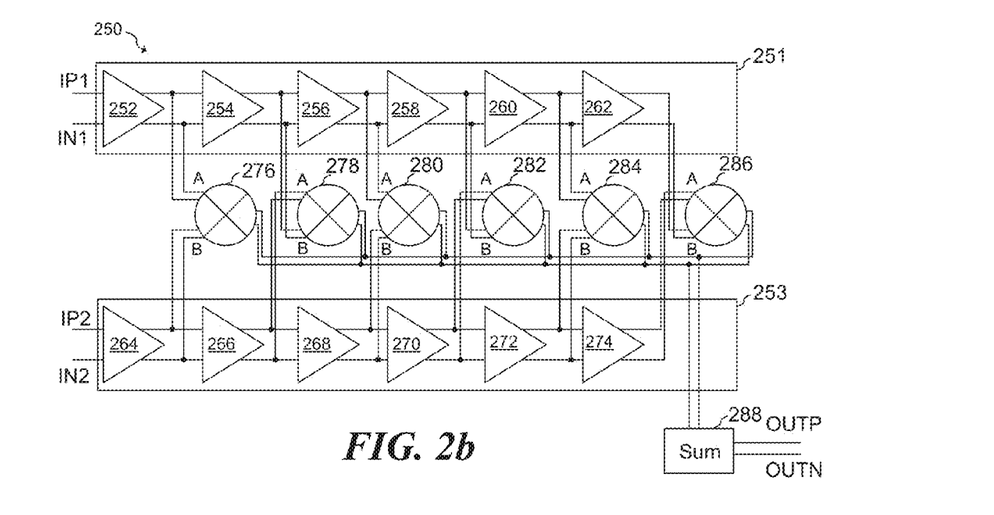

FIG. 2b illustrates embodiment phase detector 250 that is implemented using a differential signal path. In some embodiments, using a differential signal path may provide a better dynamic range than a single-ended approach, as well as being resistant to common mode and power supply disturbances. A first logarithmic amplifier 251 includes differential amplifiers 252, 254, 256, 258, 260 and 262. A second logarithmic amplifier 253 includes differential amplifiers 264, 266, 268, 270, 272 and 274. Mixers 276, 280, and 284 are coupled to various amplifiers in first logarithmic amplifier 251 via input port A and to various amplifiers in second logarithmic amplifier 253 via input port B. Remaining mixers 278, 282 and 286 are coupled to various amplifiers in first logarithmic amplifier 251 via input port B and to various amplifiers in second logarithmic amplifier 253 via input port A. The output of mixers 276, 278, 280, 282, 284 and 286 are summed via summing block 288.

Figure 3A:
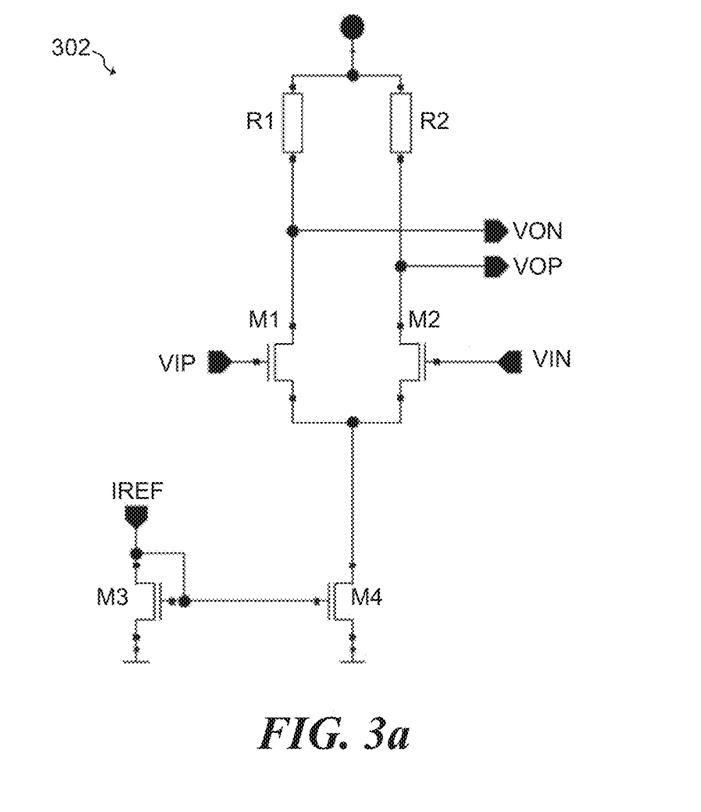
FIGS. 3a-c illustrate schematics of circuits used in embodiment phase detectors.
Figure 3B:
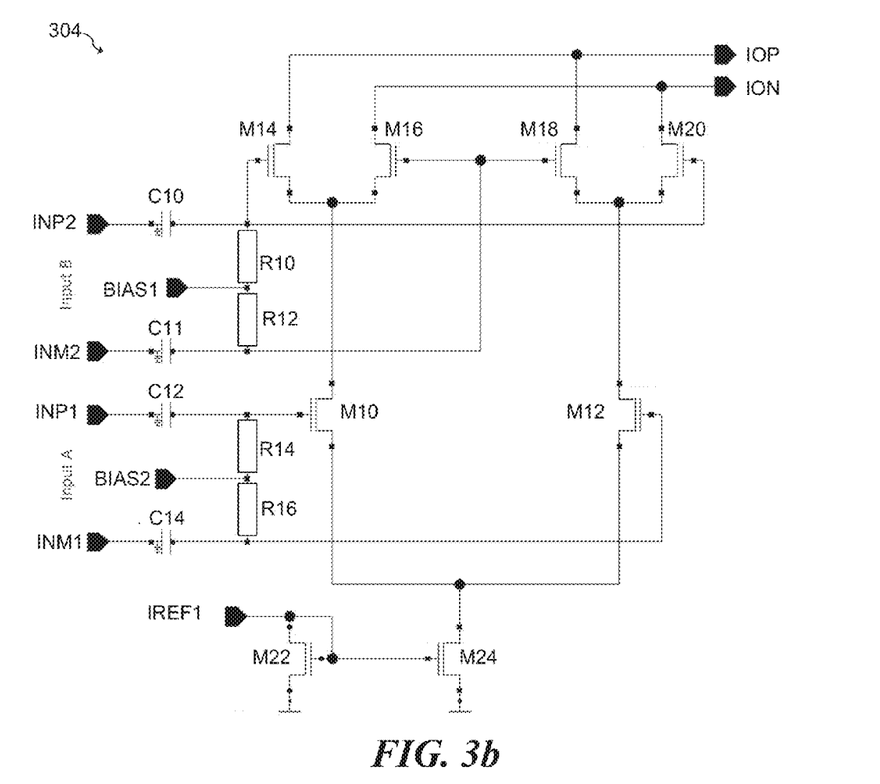
Figure 3C:
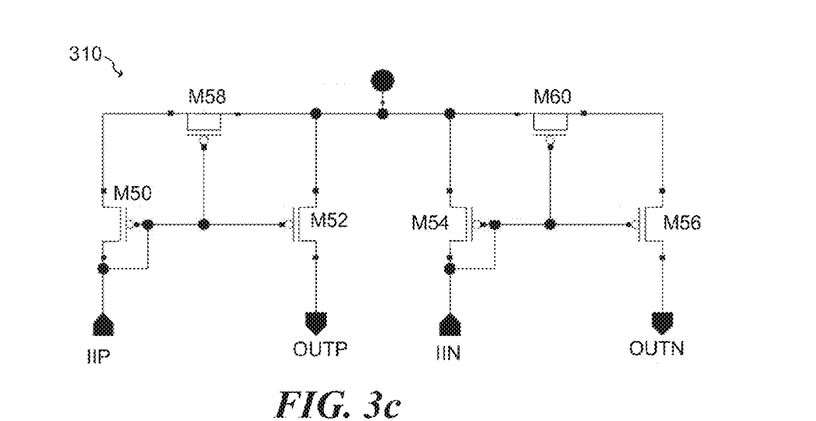

FIGS. 3a-c illustrate schematics of embodiment circuits that may be used to implement the various circuit blocks shown in FIG. 2b. FIG. 3a illustrates a schematic of differential amplifier 302 that may be used, for example, to implement differential amplifiers 252, 254, 256, 258, 260, 262, 264, 266, 268, 270, 272 and 274. Differential amplifier 302 includes NMOS differential pair that includes transistors M1 and M2 are loaded by resistors R1 and R2. Bias current is provided to the differential pair via current source transistor M4, which forms the output device of a current mirror that mirrors current IREF from NMOS transistor M3. It should be understood that the embodiment shown in FIG. 3a is just one example of an embodiment differential amplifier. In alternative embodiments of the present invention, other topologies known in the art may be used.

FIG. 3b illustrates an example double balanced mixer 304 that may be used to implement mixers 276, 278, 280, 282, 284 and 286. Mixer 304 includes a first differential pair made of NMOS transistors M10 and M12 that are coupled to inputs INP1 and INM1 of input port A. A second differential input pair that includes NMOS transistors M14 and M16 is stacked on top of transistor M10, and a third differential input pair that includes NMOS transistors M18 and M20 is stacked on top of transistor M12 and are coupled to inputs INP2 and INM2 of input port B. In the depicted embodiment, input ports A and B are AC coupled to the gates of the three differential pairs via AC coupling capacitors C12, C14, C10, and C11. The gates of transistors M10 and M12 are biased using a bias voltage BIAS2 via resistors R14 and R16. Similarly, the gates of transistors M14, M16, M18 and M20 are biased using a bias voltage BIAS1 via resistors R10 and R12. Tail current for the first differential pair is provided using a current minor made of NMOS transistors M 22 and M24 that mirror current IREF1. In some embodiments, input port A has a higher propagation delay than input port B because signals introduced to input port A propagate through transistors M10 and M12 as well as through transistors M14, M16, M18 and M20, while signals introduced to input port B only propagate though transistors M14, M16, M18 and M20. Such mixers may be referred to as "asymmetric mixers." In alternative embodiments, other mixer circuits may be used in which input port A has a substantially equal propagation delay to the output port as input port B. Mixers having a substantially equal propagation delay from the various input ports to the output port may be referred to as "symmetric mixers."

FIG. 3c illustrates summing circuit 310 that sums the output currents of mixers 276, 278, 280, 282, 284 and 286 in the current domain. For example, mixer outputs are coupled to input nodes IIP and IIN. These current are mirrors to output nodes OUTP and OUTN via current mirror that includes PMOS transistors M50 and M52, and an output minor that includes PMOS transistors M54 and M56. PMOS transistors M58 and M60 function as capacitors and provide lowpass filtering of the output current.

Figure 4A:
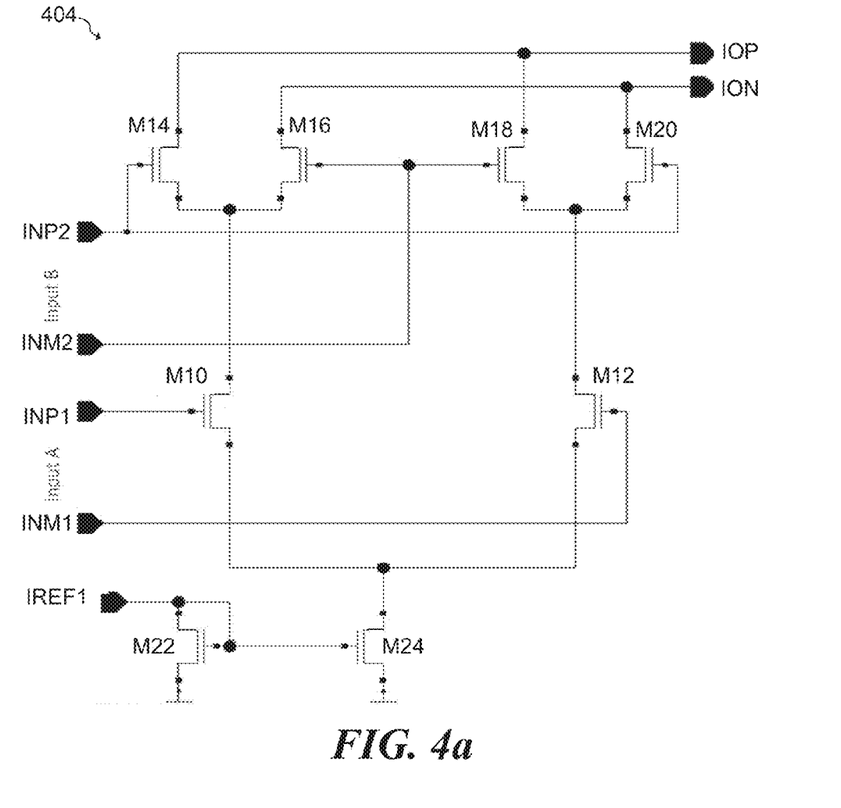
FIGS. 4a-b illustrate schematics of circuits used in further embodiment phase detectors.

In an alternate embodiments of the present invention, the signal path of the logarithmic amplifiers within the phase detector may be implemented using DC coupled mixers, an example of which is illustrated in FIG. 4a. In an embodiment, mixer 404 has a similar topology as mixer 304 illustrated in 3b, except that there are no AC coupling capacitors or input bias networks. Rather, the common mode voltage of inputs INP1, INM1, INP2 and INM2 are set by the outputs of the cascaded amplifiers. In particular, input port A, which includes transistors M10 and M12, is biased with a lower voltage than input port B, which includes transistors M14, M16, M18 and M20.

Figure 4B:
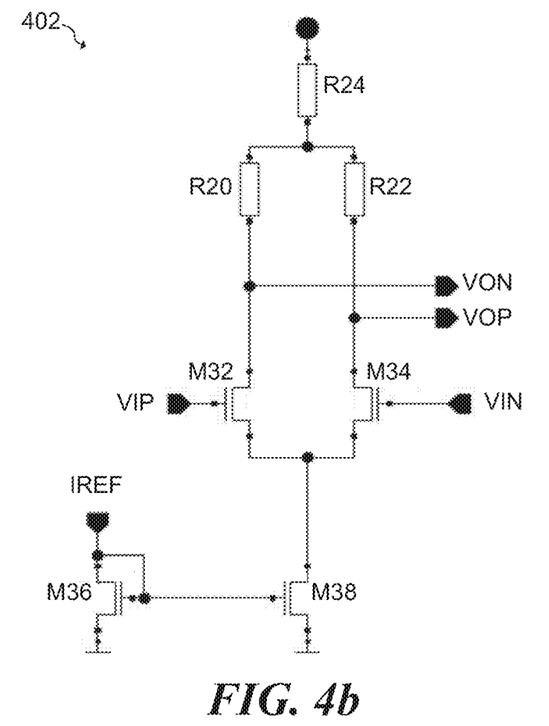

In such an embodiment, the output of amplifiers 252, 266, 256, 270, 260, and 274 are coupled to input port A of the mixers, and may be implemented using the differential amplifier shown in FIG. 4b. Differential amplifier 402 in FIG. 4b is similar to differential amplifier 302 in FIG. 3a with the addition of resistor R24 that shifts the common mode output to a lower voltage to have a common mode input voltage compatible with input port A. Amplifiers 264, 254, 268, 258, 272 and 262, on the other hand may implemented using differential amplifier 302 illustrated in FIG. 3a, which may be biased to provide a common mode output signal compatible with input port B.

While NMOS and PMOS transistors are used in the embodiments of FIGS. 3a-c and FIGS. 4a-b, it should be appreciated that other device types, such as bipolar transistors and JFETs may be used to implement the mixers and amplifiers. In further embodiments, NMOS and PMOS device types may be reversed, for example, in implementations that utilize a negative power supply. In such embodiments, differential amplifiers may be implemented using PMOS devices.

Figure 5A:
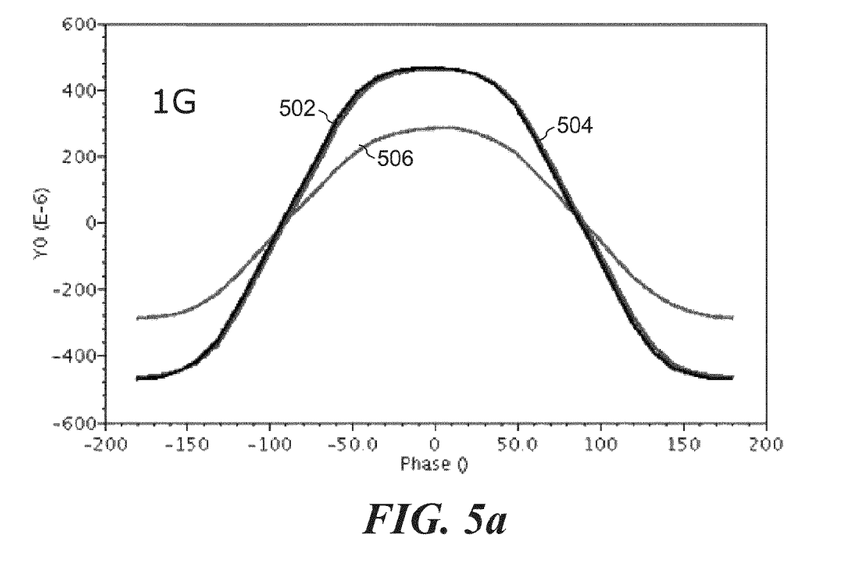
FIGS. 5a-d illustrate waveform diagrams depicting the performance of an embodiment phase detector.

FIGS. 5a-d illustrate waveforms representing the performance of an embodiment phase detector. FIG. 5a illustrates an output current versus phase error plot for 1 GHz input signals. Waveform 502 represents an input of 500 mV, waveform 504 illustrates an input of 255 mV and waveform 506 illustrates an input of 10 mV. As can be seen, the output versus phase performance represented by waveforms 502, 504 and 506 are symmetric about 0° of phase. Because embodiment phase detectors are implemented using logarithmic amplifiers, the output characteristic of waveforms 502 and 504 show about the same amplitude. Waveform 506 representing the 10 mV input signal, however, has a lower amplitude because none of the amplifiers are saturated with a 10 mV input in this example.

Figure 5B:
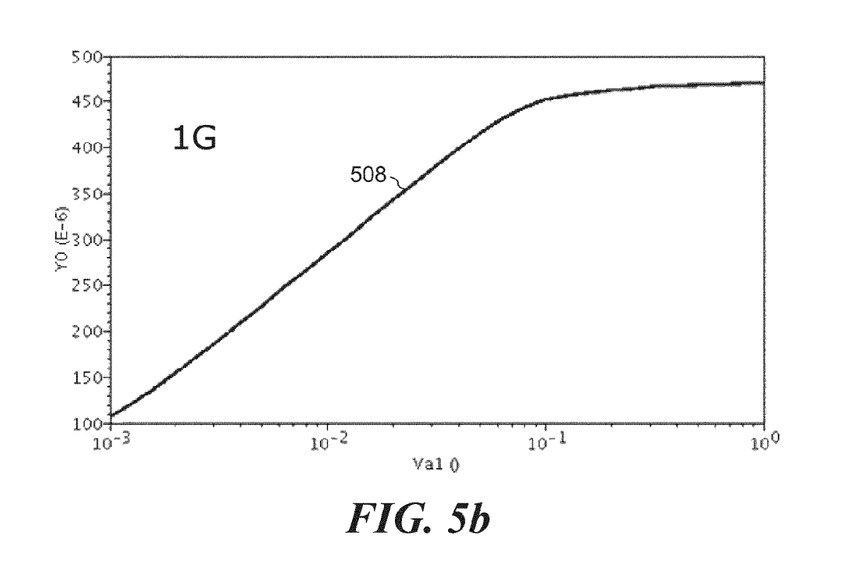

FIG. 5b illustrates an output DC component from the mixers versus input amplitude 508 for an embodiment phase detector for 1 GHz input signals in which the x-axis is plotted logarithmically. It can be seen that the output versus input amplitude characteristic is loglinear up to about an input of 60 mV.

Figure 5C:
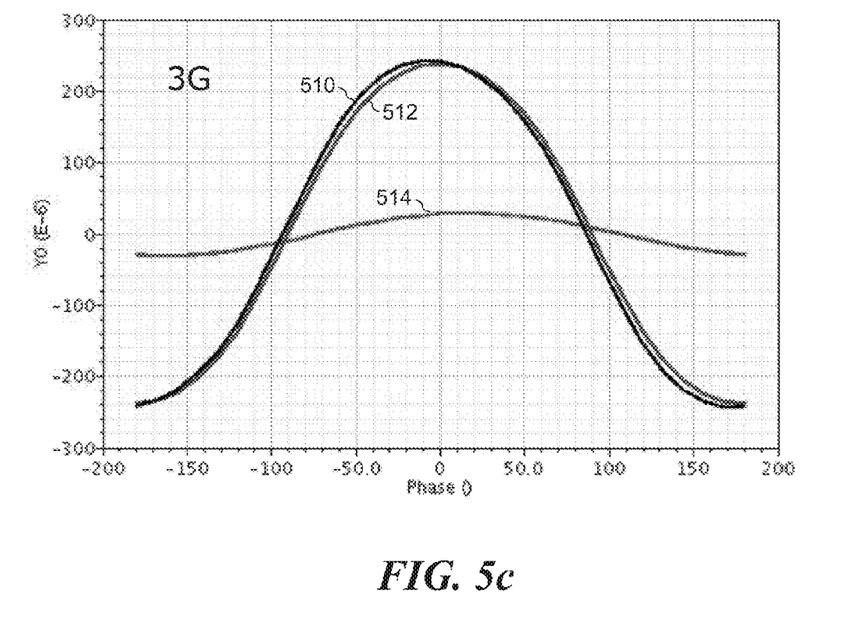

FIG. 5c illustrates an output current versus phase error plot for 3 GHz input signals. Waveform 510 represents an input of 500 mV, waveform 512 illustrates an input of 255 mV and waveform 514 illustrates an input of 10 mV. As can be seen, the output versus phase performance represented by waveforms 510 and 512 are symmetric about 0° of phase, while the output versus phase performance represented by waveform 514 shows some phase error. In some embodiments, some phase error may be present with low amplitude signals and high frequency when the output of a single mixer dominates a phase measurement.

Figure 5D:
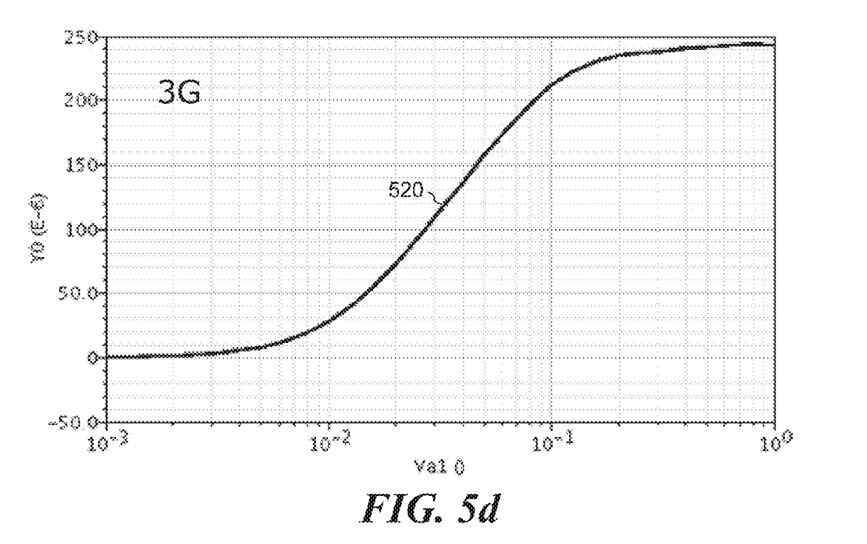

FIG. 5d illustrates an output amplitude versus input amplitude 520 for an embodiment phase detector for 3 GHz input signals in which the x-axis is plotted logarithmically. It can be seen that the output versus input amplitude characteristic is loglinear up to an input of about 100 mV.

Figure 6A:
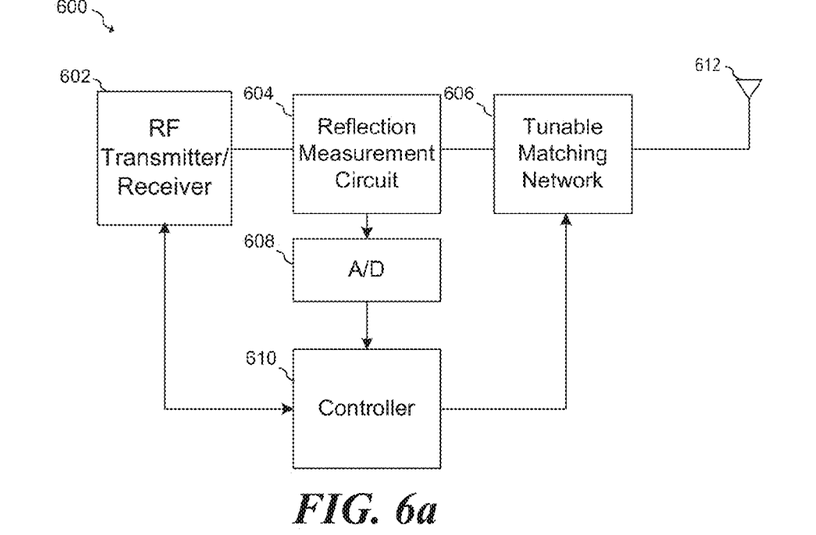
FIGS. 6a-c illustrate various embodiment RF systems that utilize embodiment phase detectors.

FIG. 6a illustrates RF system 600 according to an embodiment of the present invention. System 600 includes RF transceiver 602 coupled to antenna 612 via embodiment reflection measurement circuit 604 and tunable matching network 606. Reflection measurement circuit 604 may be implemented, for example, using the reflection measurement circuit illustrated in FIG. 1d that includes phase detector 13 implemented by embodiment phase detectors shown in FIGS. 2a-b. The power measurement output of reflection measurement circuit 604 is coupled to A/D converter 608, the output of which is coupled to controller 610. In an embodiment, controller 610 adjusts tunable matching network 606 according to the digitized output of A/D converter 608. When reflection measurement circuit 604 detects an impedance mismatch between the RF transceiver 602 and the input to tunable matching network 606, controller 610 adjusts tunable matching network 606 until the measured it mismatch in impedance falls below a predetermined threshold in some embodiments. In some embodiments, controller 610 may be implemented, for example, using a processor, microcontroller, or dedicated system logic. RF system 600 may be implemented, for example, in the front end of a cellular telephone, wireless local area network transceiver, or other radio frequency system. In some embodiments, tunable matching network 606 is coupled between RF transceiver 602 and reflection measurement circuit 604, as shown in FIG. 6b with respect to system 620.

Figure 6B:
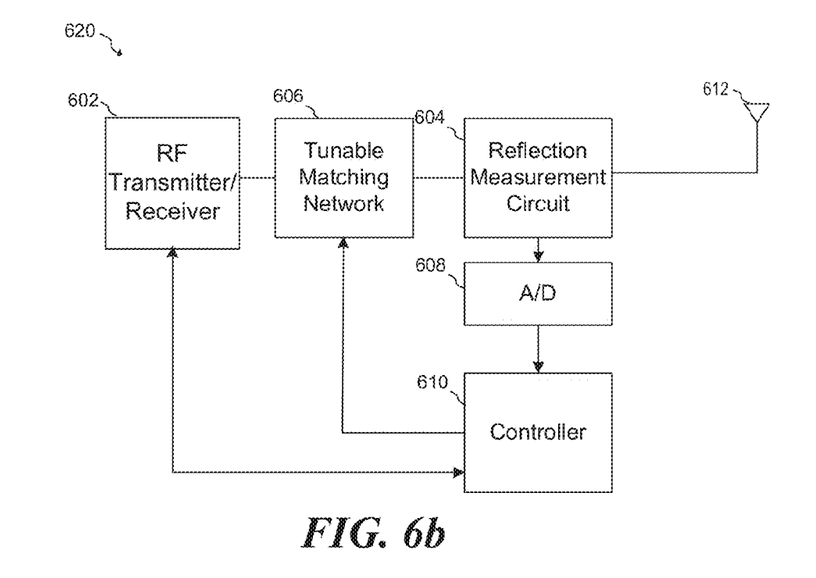
Figure 6C:
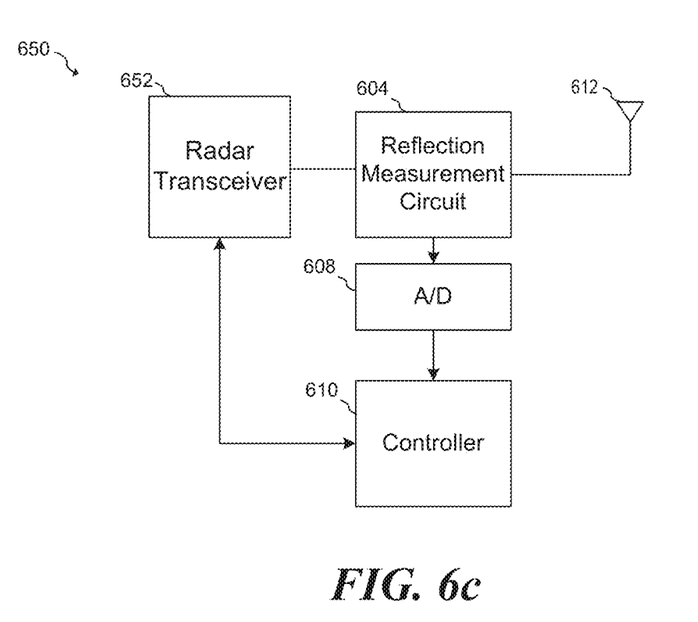

FIG. 6c illustrates embodiment radar system 650 according to another embodiment of the present invention. System 650 includes radar transceiver 652 coupled to antenna 612 via embodiment reflection measurement circuit 604. The output of the reflection measurement circuit 604 is coupled to the controller 610 via analog to digital converter 608. In an embodiment, reflection measurement circuit 604 measures an incident signal from antenna 612 that may represent a reflected radar pulse. System 650 may be used, for example, a radar system such as automotive or proximity radar systems. Reflection measurement circuit 604 may be implemented, for example, using the embodiments of FIG. 1d. Other example systems that may utilize embodiment reflection measurement circuits include power monitoring in planar inverted F antenna (PIFA) feed-point tuners.

It should be appreciated that the embodiment shown in FIGS. 6a-c are just three examples of the many embodiment systems that may be implemented using embodiment reflection measurement circuits utilizing embodiment phase detectors.

Figure 7:
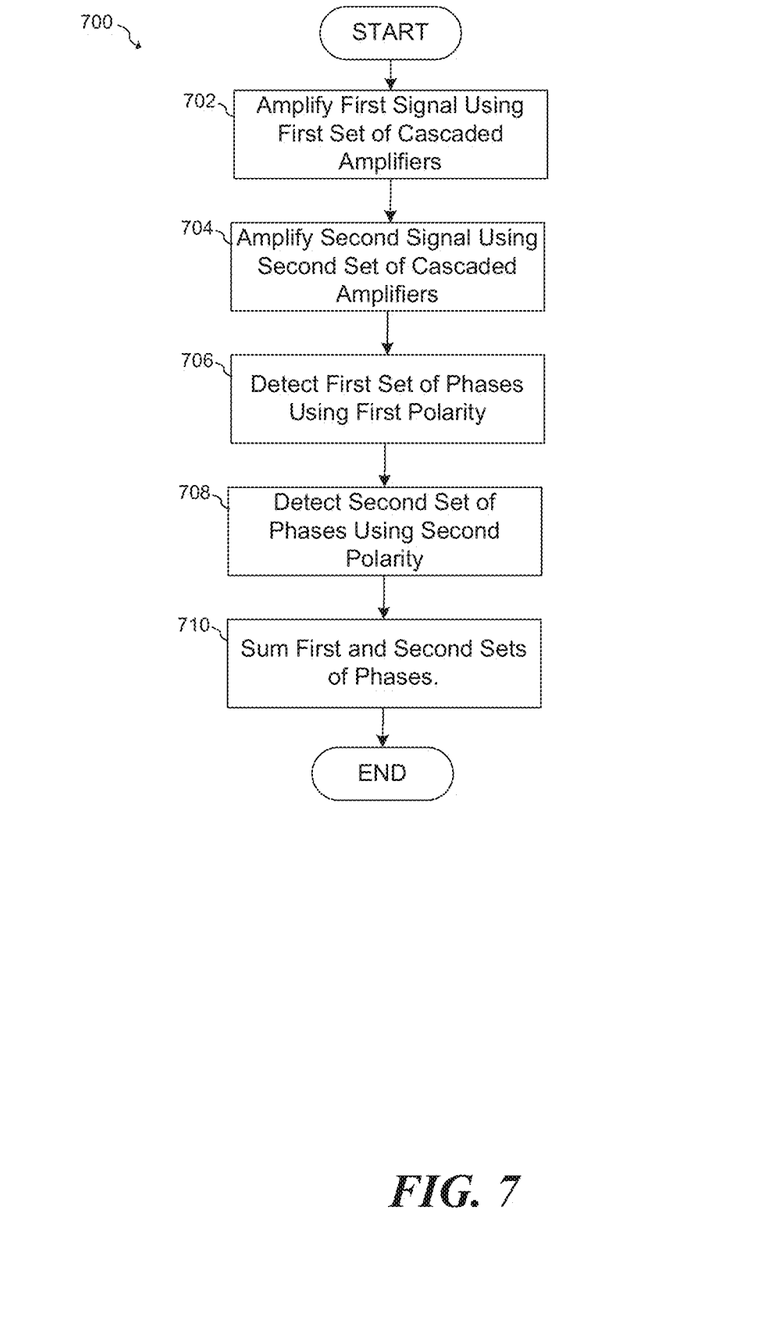
FIG. 7 illustrates a block diagram of an embodiment method.

FIG. 7 illustrates a block diagram 700 of an embodiment method of detecting a phase difference. In step 702, a first signal is amplified using a first set of cascaded amplifiers, and in step 704, a second signal is amplified using a second set of cascaded amplifiers. In step 706, a first set of phases is detected using a first polarity and in step 708, a second set of phases are detected using a second polarity. In an embodiment, the first set of phases are detected using a first set of mixer circuits having first inputs coupled to respective outputs of a first group of the first set of cascaded amplifiers and second inputs coupled to respective outputs of a third group of the second cascaded amplifiers, and the second set of phases are detected using a second set of mixer circuits having first inputs coupled to respective outputs of a fourth group of the second set of cascaded amplifiers and second inputs coupled to respective outputs of a second group of the first set of cascaded amplifiers. In step 710, the outputs of the first set of double-balanced mixer circuits and outputs of the second set of double-balanced mixer circuits are summed together to form a phase detector output. The mixer circuits used in the method described by block diagram 700 may be implemented using double balanced mixer circuits or other types of mixer circuits.

Embodiment phase detectors may be applied to other coupler and reflection measurement arrangements, such as those described in co-pending U.S. patent application Ser. No. 13/931,092 entitled, "System and Method for a Transformer and a Phase-Shift Network" and filed on Jun. 28, 2013, which is incorporated by reference herein it its entirety.

In accordance with an embodiment, a phase detector circuit includes a plurality of cascaded RF stages that each has a first RF amplifier and a second RF amplifier. The first RF amplifiers are cascaded with first RF amplifiers of successive RF stages, and the second RF amplifiers are cascaded with second RF amplifiers of successive RF stages. The phase detector further includes a first mixer having a first input coupled to an output of a first RF amplifier of a first RF stage and a second input coupled to an output of a second RF amplifier of the first RF stage, and a second mixer having a first input coupled to an output of a second RF amplifier of a second RF stage and a second input coupled to an output of a first RF amplifier of the second RF stage.

In an embodiment, the first input of the first mixer is a type A input and the second input of the first mixer is a type B input, the first input of the second mixer is a type A input and the second input of the second mixer is a type B input, and a propagation delay between each type A input and a corresponding output is greater than a propagation delay of a corresponding type B input and a corresponding output.

The circuit may further include a third mixer having a first input coupled to an output of a first RF amplifier of a third RF stage and a second input coupled to an output of a second RF amplifier of the third RF stage. In such an embodiment, the first input of the third mixer is a type A input, the second input of the third mixer is a type B input, and a propagation delay between the type A input and an output of the third mixer is greater than a propagation delay of the type B input and the output of the third mixer. The first mixer and second mixer may be asymmetric mixers or symmetric mixers in some embodiments.

The output of the first mixer and the output of the second mixer may be coupled together at a summing node and/or the first mixer may be configured to output a current and the second mixer is configured to output a current. The circuit may further include a current minor coupled between the summing node and an output node.

In an embodiment, the circuit includes a third mixer having a first input coupled to an output of a first RF amplifier of a third RF stage and a second input coupled to an output of a second RF amplifier of the third RF stage. Outputs of the first RF stage may be directly connected to inputs of the second RF stage, and outputs of the second RF stage may be directly connected to inputs of the third RF stage.

In an embodiment, the first mixer is a first double-balanced mixer, the second mixer is a second double-balanced mixer, the first amplifier is a first differential pair coupled to first load resistors, and the second amplifier comprises a second differential pair coupled to second load resistors. The first mixer, the second mixer, the first amplifier and the second amplifier may comprise MOS transistors or transistors of other types.

In accordance with a further embodiment, a circuit includes a phase detector having a first set of cascaded amplifiers comprising a first group and a second group, and a second set of cascaded amplifiers comprising a third group and a fourth group. A first amplifier of the first set of cascaded amplifiers is coupled to a first phase detector input, and the first amplifier of the second set of cascaded amplifiers is coupled to a second phase detector input. The circuit also includes a first set of mixer circuits having first inputs coupled to respective outputs of the first group of cascaded amplifiers and second inputs coupled to respective outputs of the third group of cascaded amplifiers, and a second set of mixer circuits having first inputs coupled to respective outputs of the fourth group of cascaded amplifiers and second inputs coupled to respective outputs of the second group of cascaded amplifiers. The circuit further includes an output node coupled to provide a sum of outputs of the first set of mixer circuits and outputs of the second set of mixer circuits.

In an embodiment, the first set of mixer circuits may be implemented using a first set of double-balanced mixer circuits, and the second set of mixer circuits may be implemented using a second set of double-balanced mixer circuits. Each double-balanced mixer of the first set of double-balanced mixers and the second set of double-balanced mixers may include a first differential pair of transistors coupled to the first input, a second differential pair of transistors coupled to the second input and to a first output of the first differential pair, and a third differential pair of transistors coupled to the second input and to a second output of the first differential pair. The first differential pair of transistors may be a first differential pair of MOS transistors, the second differential pair of transistors may be a second differential pair of MOS transistors, and the third differential pair of transistors may be a third differential pair of MOS transistors. In an embodiment, outputs of the first set of mixer circuits and the outputs of the second set of mixer circuits may be directly connected together.

In an embodiment, the first group of the first set of cascaded amplifiers and the third group of the second set of cascaded amplifiers include odd amplifier stages, and the second group of the first set of cascaded amplifiers and the fourth group of the second set of cascaded amplifiers include even amplifier stages.

The circuit may further include an RF coupler having a first output coupled to the first phase detector input and a second output coupled to the second phase detector input. The circuit may also include a first power detector coupled to the first phase detector input, and a second power detector coupled to the second phase detector input.

In accordance with a further embodiment, a method of detecting a phase difference between a first signal and a second signal includes amplifying the first signal using a first set of cascaded amplifiers, amplifying the second signal using a second set of cascaded amplifiers, and detecting a first and second set of phases. The first set of phases are detected using a first set of mixer circuits having first inputs coupled to respective outputs of a first group of the first set of cascaded amplifiers and second inputs coupled to respective outputs of a third group of the second set of cascaded amplifiers. The second set of phases are detected using a second set of mixer circuits having first inputs coupled to respective outputs of a fourth group of the second set of cascaded amplifiers and second inputs coupled to respective outputs of a second group of the first set of cascaded amplifiers. The method further includes summing outputs of the first set of mixer circuits and outputs of the second set of mixer circuits.

In an embodiment, the first set of mixer circuits comprises a first set of double-balanced mixer circuits, and the second set of mixer circuits comprises a second set of double-balanced mixer circuits. Summing the outputs may include summing output currents of the first set of mixer circuits and the second set of mixer circuits.

In an embodiment, each mixer of the first set of mixers and the second set of mixers has a first propagation delay from the first input of the mixer to the output of the mixer, each mixer of the first set of mixers and the second set of mixers has a second propagation delay from the second input of the mixer to the output of the mixer, the first propagation delay is greater than the second propagation delay. Summing the outputs may include equalizing the first propagation delay and the second propagation delay.

In an embodiment, the method further includes providing the first signal and the second signal from outputs of a directional coupler. The method may also include detecting an amplitude of the first signal and an amplitude of the second signal.

Advantages of embodiments in which signals are fed into mixers via logarithmic amplifiers include a log-linear conversion gain having a high dynamic range. Advantages of embodiments in which the mixers are cross-coupled at various gain stages include low phase offset and a phase transfer characteristic that may be symmetrical at about 0 degrees. Further advantages of embodiments include dynamically-controllable conversion gain and offset of the phase transfer characteristic performed by enabling/disabling gain stages of logarithmic amplifiers and mixers cells coupled to gain stages of the logarithmic amplifiers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A phase detector circuit comprising:
a plurality of cascaded RF stages, each of the plurality of cascaded RF stages having a first RF amplifier and a second RF amplifier, wherein first RF amplifiers are cascaded with first RF amplifiers of successive RF stages and second RF amplifiers are cascaded with second RF amplifiers of successive RF stages;
a first mixer having a first input coupled to an output of a first RF amplifier of a first RF stage, and a second input coupled to an output of a second RF amplifier of the first RF stage; and
a second mixer having a first input coupled to an output of a second RF amplifier of a second RF stage, and a second input coupled to an output of a first RF amplifier of the second RF stage.

2. The circuit of claim 1, wherein:
the first input of the first mixer is a type A input and the second input of the first mixer is a type B input;
the first input of the second mixer is a type A input and the second input of the second mixer is a type B input; and
a propagation delay between each type A input and a corresponding output is greater than a propagation delay of a corresponding type B input and a corresponding output.

3. The circuit of claim 2, further comprising:
a third mixer having a first input coupled to an output of a first RF amplifier of a third RF stage, and a second input coupled to an output of a second RF amplifier of the third RF stage, wherein
the first input of the third mixer is a type A input and the second input of the third mixer is a type B input,
a propagation delay between the type A input and an output of the third mixer is greater than a propagation delay of the type B input and the output of the third mixer.

4. The circuit of claim 1, wherein the first mixer and second mixer are asymmetric mixers.

5. The circuit of claim 1, wherein the first mixer and the second mixer are symmetric mixers.

6. The circuit of claim 1, wherein the output of the first mixer and the output of the second mixer are coupled together at a summing node.

7. The circuit of claim 6, wherein the first mixer is configured to output a current and the second mixer is configured to output a current.

8. The circuit of claim 7, further comprising a current mirror coupled between the summing node and an output node.

9. The circuit of claim 1, further comprising a third mixer having a first input coupled to an output of a first RF amplifier of a third RF stage, and a second input coupled to an output of a second RF amplifier of the third RF stage.

10. The circuit of claim 9, wherein:
outputs of the first RF stage is directly connected to inputs of the second RF stage; and
outputs of the second RF stage is directly connected to inputs of the third RF stage.

11. The circuit of claim 1, wherein:
the first mixer comprises a first double-balanced mixer;
the second mixer comprises a second double-balanced mixer;
the first amplifier comprises a first differential pair coupled to first load resistors; and
the second amplifier comprises a second differential pair coupled to second load resistors.

12. The circuit of claim 11, wherein the first mixer, the second mixer, the first amplifier and the second amplifier comprise MOS transistors.

13. A circuit comprising a phase detector, wherein the phase detector includes:
a first set of cascaded amplifiers comprising a first group and a second group, wherein a first amplifier of the first set of cascaded amplifiers is coupled to a first phase detector input;
a second set of cascaded amplifiers comprising a third group and a fourth group, wherein the first amplifier of the second set of cascaded amplifiers is coupled to a second phase detector input;
a first set of mixer circuits having first inputs coupled to respective outputs of the first group of cascaded amplifiers and second inputs coupled to respective outputs of the third group of cascaded amplifiers;
a second set of mixer circuits having first inputs coupled to respective outputs of the fourth group of cascaded amplifiers and second inputs coupled to respective outputs of the second group of cascaded amplifiers; and
an output node coupled to provide a sum of outputs of the first set of mixer circuits and outputs of the second set of mixer circuits.

14. The circuit of claim 13, wherein:
the first set of mixer circuits comprises a first set of double-balanced mixer circuits; and
the second set of mixer circuits comprises a second set of double-balanced mixer circuits.

15. The circuit of claim 14, wherein each double-balanced mixer of the first set of double-balanced mixers and the second set of double-balanced mixers comprise:
a first differential pair of transistors coupled to the first input;
a second differential pair of transistors coupled to the second input and to a first output of the first differential pair; and
a third differential pair of transistors coupled to the second input and to a second output of the first differential pair.

16. The circuit of claim 15, wherein,
the first differential pair of transistors comprises a first differential pair of MOS transistors;
the second differential pair of transistors comprises a second differential pair of MOS transistors; and
the third differential pair of transistors comprises a third differential pair of MOS transistors.

17. The circuit of claim 13, wherein the outputs of the first set of mixer circuits and the outputs of the second set of mixer circuits are directly connected together.

18. The circuit of claim 13, wherein
the first group of the first set of cascaded amplifiers and the third group of the second set of cascaded amplifiers comprise odd amplifier stages; and
the second group of the first set of cascaded amplifiers and the fourth group of the second set of cascaded amplifiers comprise even amplifier stages.

19. The circuit of claim 13, further comprising an RF coupler having a first output coupled to the first phase detector input and a second output coupled to the second phase detector input.

20. The circuit of claim 19, further comprising a first power detector coupled to the first phase detector input, and a second power detector coupled to the second phase detector input.

21. A method of detecting a phase difference between a first signal and a second signal, the method comprising:
amplifying the first signal using a first set of cascaded amplifiers;
amplifying the second signal using a second set of cascaded amplifiers;
detecting a first set of phases using a first set of mixer circuits having first inputs coupled to respective outputs of a first group of the first set of cascaded amplifiers and second inputs coupled to respective outputs of a third group of the second set of cascaded amplifiers;
detecting a second set of phases using a second set of mixer circuits having first inputs coupled to respective outputs of a fourth group of the second set of cascaded amplifiers and second inputs coupled to respective outputs of a second group of the first set cascaded amplifiers; and
summing outputs of the first set of mixer circuits and outputs of the second set of mixer circuits.

22. The method of claim 21, wherein:
the first set of mixer circuits comprises a first set of double-balanced mixer circuits; and
the second set of mixer circuits comprises a second set of double-balanced mixer circuits.

23. The method of claim 21, wherein summing the outputs comprises summing output currents of the first set of mixer circuits and the second set of mixer circuits.

24. The method of claim 21, wherein:
each mixer of the first set of mixers and the second set of mixers has a first propagation delay from the first input of the mixer to the output of the mixer;
each mixer of the first set of mixers and the second set of mixers has a second propagation delay from the second input of the mixer to the output of the mixer; and
the first propagation delay is greater than the second propagation delay.

25. The method of claim 24, wherein summing the outputs comprises equalizing the first propagation delay and the second propagation delay.

26. The method of claim 21, further comprising providing the first signal and the second signal from outputs of a directional coupler.

27. The method of claim 26, further comprising detecting an amplitude of the first signal and an amplitude of the second signal.

* * * * *